US012719251B2

(12) United States Patent
Isunza et al.

(10) Patent No.: US 12,719,251 B2
(45) Date of Patent: Aug. 25, 2026

(54) COVER TABS FOR ELECTROMAGNETIC COMPATIBILITY IN JUNCTION BOX

(71) Applicant: Schaeffler Technologies AG & Co. KG, Herzogenaurach (DE)

(72) Inventors: Alejandro Isunza, Puebla (MX); Christopher Chapanar, Massillon, OH (US); Kyle Nelson, Wadsworth, OH (US)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 241 days.

(21) Appl. No.: 18/429,647

(22) Filed: Feb. 1, 2024

(65) Prior Publication Data

US 2025/0253633 A1 Aug. 7, 2025

(51) Int. Cl.

*H02G 3/14* (2006.01)
*H02G 3/08* (2006.01)
*H05K 9/00* (2006.01)

(52) U.S. Cl.

CPC ............... *H02G 3/14* (2013.01); *H02G 3/081* (2013.01); *H05K 9/0009* (2013.01)

(58) Field of Classification Search

CPC ............ H02G 3/08; H02G 3/081; H02G 3/14; H05K 5/00; H05K 5/02; H05K 9/0009; H01R 13/447; H01R 13/46

USPC ........... 174/50, 53, 57, 58, 66, 67, 520, 535; 220/3.2–3.9, 4.02; 248/906

See application file for complete search history.

(56) References Cited

U.S. PATENT DOCUMENTS 4,260,863 A * 4/1981 Appleton ............... H01H 9/043 218/139
4,620,061 A * 10/1986 Appleton ................. H02G 3/14 D13/152
4,632,269 A * 12/1986 Rose ........................ H05K 5/13 220/327
6,570,089 B1 * 5/2003 Mc Grew .............. H02G 3/086 174/61
6,711,859 B2 * 3/2004 Bell ......................... H05K 5/13 49/501
7,762,415 B2 * 7/2010 Matsui ................. H05K 5/0069 174/58
8,742,255 B2 * 6/2014 Pavlovic .................. H02G 3/08 361/752
9,035,201 B2 * 5/2015 Jones ..................... H02G 3/185 174/487
9,917,427 B2 * 3/2018 Rost ......................... H02G 9/00

* cited by examiner

*Primary Examiner* — Angel R Estrada
(74) *Attorney, Agent, or Firm* — Volpe Koenig

(57) ABSTRACT

A junction box assembly including a cover secured to a housing with fasteners, wherein the spacing between fasteners can be increased while maintaining electromagnetic compatibility (EMC). In one example, the cover includes contact tabs between adjacent fasteners. The contact tabs ensure proper contact of the cover with the housing to maintain EMC. Accordingly, the number of fasteners can be reduced and/or the location of the fasteners can be customized more readily. Junction box assemblies in accordance with the present disclosure can be lighter, more easily assembled, and cost less than conventional junction box assemblies.

20 Claims, 3 Drawing Sheets

COVER TABS FOR ELECTROMAGNETIC COMPATIBILITY IN JUNCTION BOX

TECHNICAL FIELD

The present disclosure relates to junction box assemblies and, more particularly, to junction box assemblies for electric vehicles.

BACKGROUND

Junction box assemblies are generally well known in electric motor (e-motor) applications. A junction box assembly is generally configured to transfer power from the power electronics unit (PEU) to the e-motor through phase bars. Many junction box assemblies include a housing having a cavity and a cover attached to the housing enclosing the cavity. For electromagnetic compatibility (EMC), junction box assemblies also provide faraday cage shielding. As such, the cover is typically joined to the housing with a plurality of spaced-apart fasteners, such as bolts or screws. To ensure proper electromagnetic shielding, the fasteners are spaced at specific intervals that ensure proper contact between the housing and the cover.

SUMMARY

Aspects of the present disclosure are directed to a junction box assembly including a cover secured to a housing with fasteners, wherein the spacing between fasteners is increased while maintaining electromagnetic compatibility. In one example, the cover includes contact tabs between spaced adjacent fasteners. The contact tabs ensure proper contact of the cover with the housing to maintain EMC. Accordingly, the number of fasteners can be reduced and/or the location of the fasteners can be customized more readily. Junction box assemblies in accordance with the present disclosure can be lighter, more easily assembled, and cost less than conventional junction box assemblies.

In accordance with one aspect, an electromagnetic compatible enclosure comprises a housing having a cavity, and a cover secured to the housing with a plurality of fasteners, the cover enclosing the cavity. The cover includes at least one protrusion adapted to engage a mating surface of the housing, and the at least one protrusion is between an adjacent pair of the plurality of fasteners.

The at least one protrusion can include a tab extending from a main body of the cover. The tab can include a cantilevered body extending from the main body of the cover. A distal end of the cantilevered body can be displaced from a plane extending through a majority of the cover prior to securing the cover to the housing, whereby the cantilevered tab is configured to deflect when secured to the housing. The cantilevered body can extend at an angle of greater than 45 degrees from the plane in a direction away from the cavity. The at least one protrusion can be centered between first and second bolts. The at least one protrusion can include first and second protrusions, and the first and second protrusions can be spaced equidistant from each other and a respective adjacent one of the pair of plurality of fasteners. The at least one protrusion can be centered between the pair of the plurality of fasteners.

In accordance with another aspect, a cover for enclosing a cavity of housing of an associated junction box comprises a cover body configured to engage a flange of the housing, the cover body having at least one pair of openings for receiving fasteners for securing the cover to the housing of the associated junction box. The cover body includes at least one protrusion adapted to engage a mating surface of the housing. The at least one protrusion can be centered between the at least one pair of openings. The at least one protrusion can include a tab extending from the cover body. The tab can include a cantilevered body. A distal end of the cantilevered body can be displaced from a plane extending through a majority of the cover body prior to securing the cover to the housing, whereby the cantilevered body is configured to deflect when secured to the housing. The at least one protrusion can include first and second protrusions, and the first and second protrusions can be spaced equidistant from each other and a respective adjacent one of the pair of openings.

In accordance with another aspect, an electromagnetic compatible enclosure comprises a housing having a cavity, and a cover secured to the housing and enclosing the cavity. At least one of the cover or the housing includes at least one protrusion adapted to engage a mating surface of the other of the housing or the cover.

The at least one protrusion can include a tab extending from a main body of the cover. The tab can include a cantilevered body extending from the main body of the cover. A distal end of the cantilevered body can be displaced from a plane extending through a majority of the cover prior to securing the cover to the housing, and the cantilevered tab can be configured to deflect when secured to the housing.

BRIEF DESCRIPTION OF THE DRAWING(S)

The foregoing Summary and the following Detailed Description will be better understood when read in conjunction with the appended drawings, which illustrate a preferred embodiment of the disclosure. In the drawings.

DETAILED DESCRIPTION OF THE PREFERRED EMBODIMENT(S)

Figure 1:
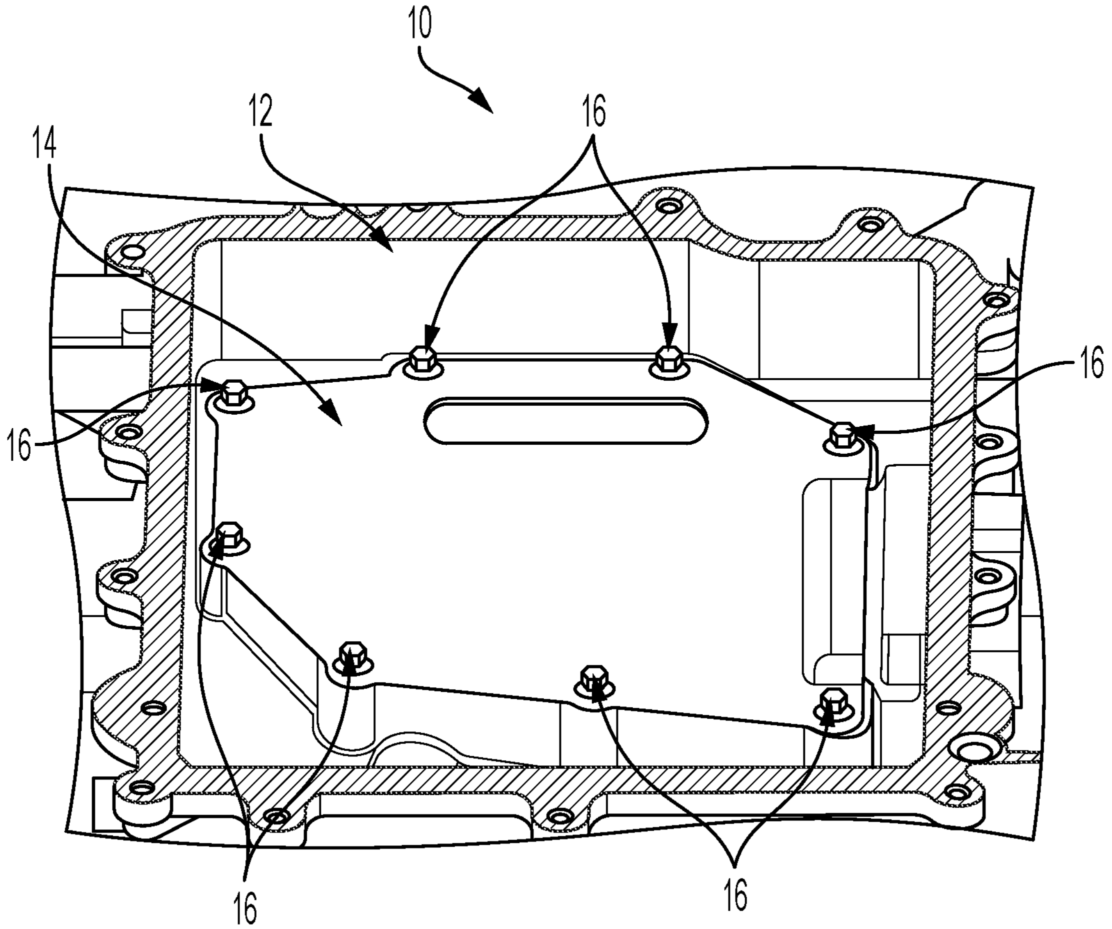
FIG. 1 is a perspective view of a prior art junction box assembly.
Figure 2:
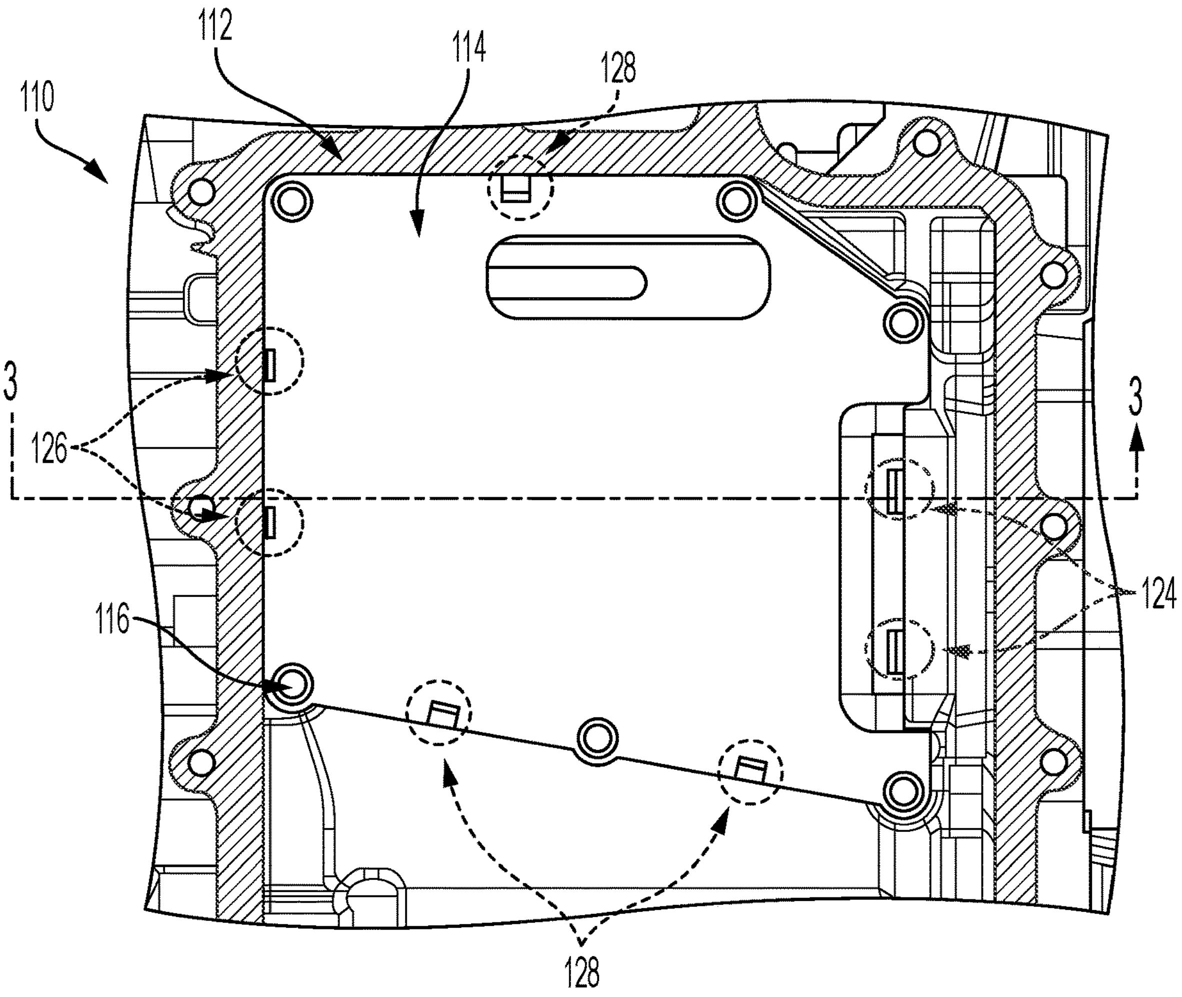
FIG. 2 is a plan view of an exemplary junction box assembly including a cover in accordance with the present disclosure.

Certain terminology is used in the following description for convenience only and is not limiting. The words "front," "rear," "upper" and "lower" designate directions in the drawings to which reference is made. The words "inwardly" and "outwardly" refer to directions toward and away from the parts referenced in the drawings. "Axially" refers to a direction along the axis of a shaft. A reference to a list of items that are cited as "at least one of a, b, or c" (where a, b, and c represent the items being listed) means any single one of the items a, b, or c, or combinations thereof. The terminology includes the words specifically noted above, derivatives thereof and words of similar import.

In FIG. 1, a conventional junction box assembly is illustrated and identified generally by reference numeral 10. The junction box assembly includes a housing 12 and a cover 14 secured to the housing with a plurality of fasteners in the form of bolts 16. The bolts 16 extend through openings in the cover 14. Although not shown, a person of skill in the art will understand that the cover 14 encloses a cavity of the housing 12, and electrical components, such as bus bars, are often contained in the cavity.

The bolts 16 are generally evenly spaced-apart about a periphery of the cover 14 to ensure proper contact between the cover 14 and the housing 12 for EMC purposes. However, the two bolts 16 on the right side of the cover 14 are spaced-apart a greater distance than the rest of the bolt 16. It should be noted that the design constraints of the housing 12 make it difficult to provide proper spacing of the bolts along the right side of the cover 14. As such, the junction box assembly 10 may not achieve a desired EMC in all instances or, alternatively, redesign of the junction box assembly would be required to add an additional fastener between the bolts 16 on the right side of the cover. The former option is not ideal and the latter option increases cost, weight and assembly times.

Turning to FIGS. 2-5, an exemplary junction box assembly in accordance with the present disclosure is illustrated and identified generally by reference numeral 110. The junction box assembly 110 includes a housing 112 and a cover 114 secured to the housing with a plurality of fasteners in the form of bolts 116. The bolts 116 extend through openings 118 (see FIG. 4) in the cover 114 into a flange 120 of the housing surrounding a cavity 122 of the housing 112. The cavity 122 of the housing 112 can contain, for example, electrical components, such as bus bars, etc.

The cover 114 includes a plurality of tabs 124, 126 and 128 (e.g., protrusions) positioned about its periphery between respective pair of bolts 116. The tabs 124, 126 and 128 differ in profile, shape and/or size, as will be described in further detail below, but each of the tab types are configured to ensure contact between the cover 114 and the housing 112 by essentially forming an interference fit with the housing 112 when the bolts 116 are tightened to secure the cover 114 to the housing 112.

The tabs 124, 126 and 128 are formed integrally with the cover 114. For example, the cover 114 can be formed in a single-step stamping process. It should be appreciated that tabs 124, 126 and 128 can be formed in such single-step stamping process and therefore no extra processing steps or costs are needed. The tabs 124, 126 and 128 are generally rectangular and extend from a main body 134 of the cover 114 in cantilevered fashion. A distal end other portion of some or all of the tabs 124, 126 and 128 is displaced from a plane of the main body 134 prior to installation of the cover 114 on the housing 112. It will be appreciated that various tab shapes and profiles can be provided, depending on whether a particular tab is adapted to engage a surface of the housing 112 that is horizontal, vertical, or has another orientation.

The tabs 124, 126 and 128 are positioned between respective pairs of bolts 116 to ensure proper contact between the housing 112 and the cover 114 to achieve a desired EMC. To this end, the tabs 124, 126 and 128 are typically configured to deflect when the bolts 116 are tightened. This deflection ensures the tabs 124, 126 and 128 maintain contact with the housing 112 under a wide range of conditions. In this regard, the tabs 124, 126 and 128 can be configured to define an interference fit with one or more surfaces of the housing 112 prior to final installation to the housing 112. Upon tightening of the bolts 116, the tabs 124, 126 and 128 deflect and are thereby preloaded into contact with respective surfaces of the housing 112.

It should be appreciated that the tabs 124, 126 and can also serve a locating function during positioning of the cover 114 on the housing 112. In this regard, one or more of the tabs 124, 126 and 128 can be configured to contact surfaces of the housing 112 to properly locate the cover 114 in position for securing to the housing 112.

In the exemplary embodiment, the cover is steel and the housing is aluminum. Due to the differences in materials, the tabs 124, 126 and 128 can be configured so as to deform/deflect without causing damage or otherwise altering the mating surface of the housing 112. For example, the thickness of the cover 114, and the shape and/or size of the tabs 124, 126 and 128 can be selected to achieve a desired tab deformation/deflection.

Figure 3:
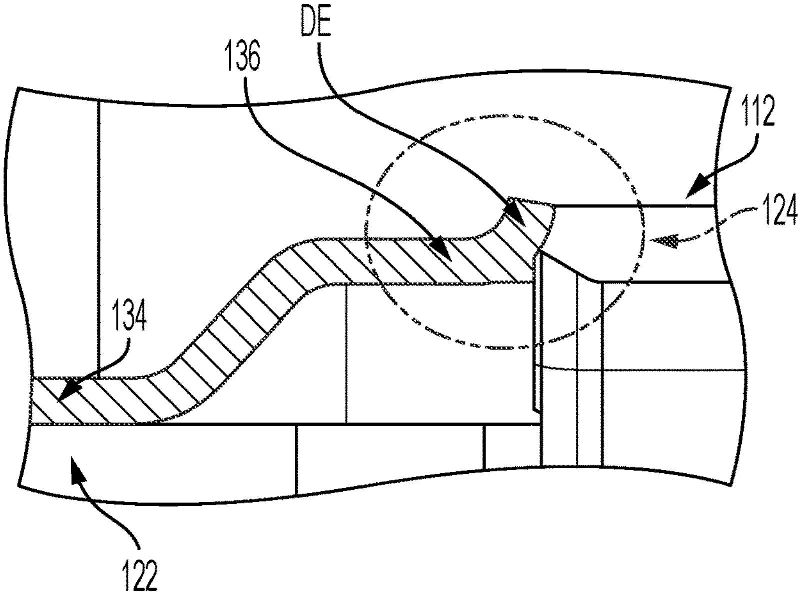
FIG. 3 is a cutaway side view of a first contact tab configuration in accordance with the present disclosure taken along the line 3-3 in FIG. 2.

In FIG. 3 illustrate a tab 124. Each tab 124 generally includes a cantilevered body 136 extending upwardly from the main body 134 of the cover 114 having a distal end DE contacting the housing 112.

Figure 4:
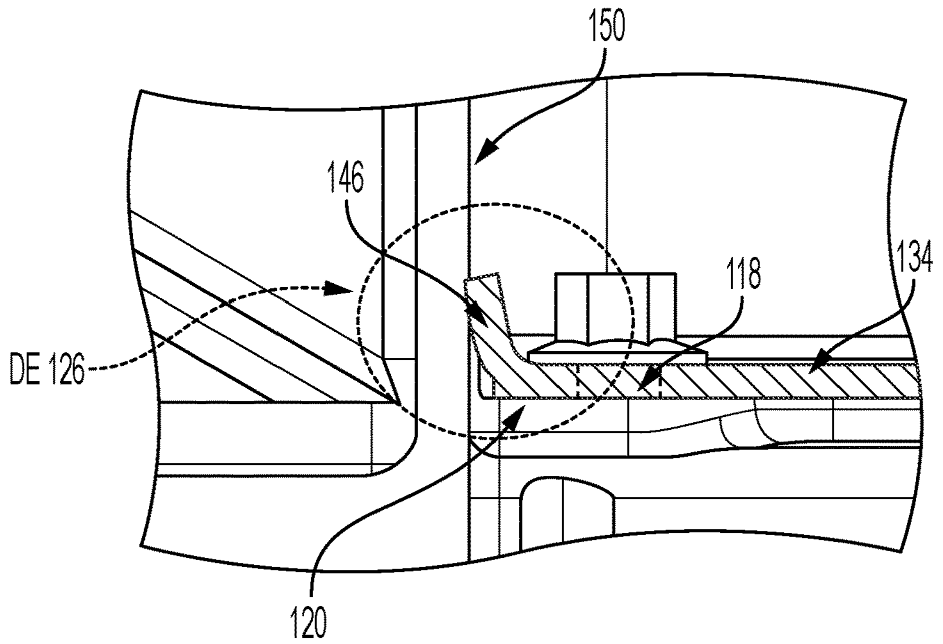
FIG. 4 is a side view of a second contact tab configuration in accordance with the present disclosure.

FIG. 4 illustrates a tab 126. Tab 126 generally includes a cantilevered body 146 extending upwardly from the main body 134 of the cover 114 for contacting a vertical surface 150 of the housing 112. The cantilevered body 146 can extend at an angle of, for example, 45 degrees with respect to the plane of the main body 134 of the cover 114 prior to installation to the housing 112. Upon tightening of the bolts 116 this angle may increase as the tab 124 is deflected.

Figure 5:
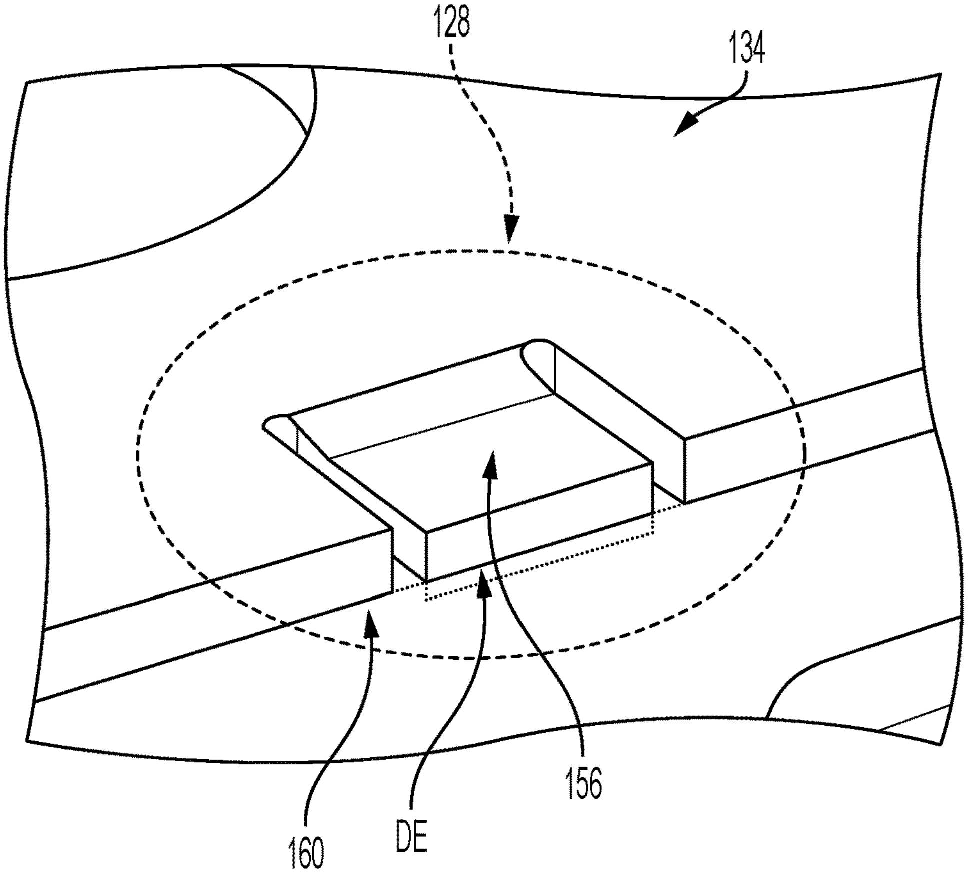
FIG. 5 is a perspective view of a third contact tab configuration in accordance with the present disclosure.

FIG. 5 illustrates a tab 128. Tab 128 generally includes a cantilevered body 156 extending downwardly from the main body 134 of the cover 114 for contacting a horizontal surface 160 of the housing 112. FIG. 6 illustrates the interference fit of the cantilevered body 156.

Although in the illustrated embodiment tabs are shown, it will be appreciated that other structures can additionally or alternatively be provided on one or both of the cover 114 and housing 112 for ensuring contact therebetween. In one example, the cover 114 can include one or more protrusions between the openings 118 for contacting the mating surface of the housing 112. Additionally, although the cover 114 in the illustrated embodiment is secured to the housing 112 with fasteners, in other embodiments the fasteners can be omitted and the cover 114 can be press fit to the housing 112 or otherwise secured to the housing 112 in other manners.

Further, it should be appreciated that aspects of the disclosure are applicable to a wide range of enclosures. Although the exemplary embodiments relate to junction box assemblies, aspects of the disclosure can be used in connection with any enclosure where electromagnetic compatibility is desired.

It will now be appreciated that aspects of the present disclosure allow greater flexibility while decreasing weight, costs and assembly time.

LOG OF REFERENCE NUMERALS

10 conventional junction box assembly
14 cover
16 bolts
110 junction box assembly
112 housing
114 cover
116 bolts
118 opening
120 flange
122 cavity
124 first tab configuration
126 second tab configuration
128 third tab configuration
134 main body of cover
136 cantilevered body

146 cantilevered body
150 vertical surface
156 cantilevered body
160 horizontal surface
DE distal end

What is claimed is:

1. An electromagnetic compatible enclosure comprising:
a housing having a cavity;
a cover secured to the housing with a plurality of fasteners, the cover enclosing the cavity;
wherein the cover includes at least one protrusion along an outer perimeter thereof adapted to engage a mating surface of the housing; and
wherein the at least one protrusion is between an adjacent pair of the plurality of fasteners; and
wherein the at least one protrusion is deformed against the mating surface of the housing when the cover is secured to the housing with the plurality of fasteners.

2. The electromagnetic compatible enclosure according to claim 1, wherein the at least one protrusion comprises a tab extending from a main body of the cover.

3. The electromagnetic compatible enclosure according to claim 2, wherein the tab includes a cantilevered body extending from the main body of the cover.

4. The electromagnetic compatible enclosure according to claim 3, wherein a distal end of the cantilevered body is displaced from a plane extending through a majority of the cover prior to securing the cover to the housing.

5. The electromagnetic compatible enclosure according to claim 4, wherein the cantilevered body extends at an angle of greater than 45 degrees from the plane in a direction away from the cavity.

6. The electromagnetic compatible enclosure according to claim 1, wherein the at least one protrusion is centered between the adjacent pair of the plurality of fasteners.

7. The electromagnetic compatible enclosure according to claim 1, wherein the at least one protrusion includes first and second protrusions, and wherein the first and second protrusions are spaced equidistant from each other and a respective adjacent one of the pair of plurality of fasteners.

8. The electromagnetic compatible enclosure according to claim 1, wherein the at least one protrusion is centered between the pair of the plurality of fasteners.

9. A cover for enclosing a cavity of housing of an associated junction box, the cover comprising:
a cover body configured to engage a flange of the housing, the cover body having at least one pair of openings for receiving fasteners for securing the cover to the housing of the associated junction box;
wherein the cover body includes at least one protrusion along an outer perimeter thereof adapted to engage a mating surface of the housing; and
wherein the at least one protrusion is between the at least one pair of openings; and
wherein the at least one protrusion is deformed against the mating surface of the housing when the cover is secured to the housing with fasteners.

10. The cover according to claim 9, wherein the protrusion is centered between the at least one pair of openings.

11. The cover according to claim 9, wherein the at least one protrusion comprises a tab extending from the cover body.

12. The cover according to claim 11, wherein the tab includes a cantilevered body.

13. The cover according to claim 12, wherein a distal end of the cantilevered body is displaced from a plane extending through a majority of the cover body prior to securing the cover to the housing.

14. The cover according to claim 13, wherein the cantilevered body extends at an angle of greater than 45 degrees from the plane.

15. The cover according to claim 9, wherein the at least one protrusion is centered between the at least one pair of openings.

16. The cover according to claim 9, wherein the at least one protrusion includes first and second protrusions, and wherein the first and second protrusions are spaced equidistant from each other and a respective adjacent one of the pair of openings.

17. An electromagnetic compatible enclosure comprising:
a housing having a cavity; and
a cover secured to the housing and enclosing the cavity;
wherein at least one of the cover or the housing includes at least one protrusion adapted to engage a mating surface of the other of the housing or the cover; and
wherein the at least one protrusion is deformed against the mating surface of the housing when the cover is secured to the housing.

18. The electromagnetic compatible enclosure according to claim 17, the at least one protrusion comprises a tab extending from a main body of the cover.

19. The electromagnetic compatible enclosure according to claim 18, wherein the tab includes a cantilevered body extending from the main body of the cover.

20. The electromagnetic compatible enclosure according to claim 19, wherein a distal end of the cantilevered body is displaced from a plane extending through a majority of the cover prior to securing the cover to the housing.

* * * * *